United States Patent [19]

Okada

[11] Patent Number: 4,849,654
[45] Date of Patent: Jul. 18, 1989

[54] SEMICONDUCTOR INTEGRATED CIRCUIT WITH INPUT PROTECTION CIRCUIT

[75] Inventor: Yoshio Okada, Tokyo, Japan
[73] Assignee: Kabushiki Kaisha Toshiba, Kawasaki, Japan
[21] Appl. No.: 158,728
[22] Filed: Feb. 22, 1988

[30] Foreign Application Priority Data

Mar. 23, 1987 [JP] Japan .................................. 62-65725

[51] Int. Cl.[4] ........................ H03K 3/01; H03K 17/16
[52] U.S. Cl. .............................. 307/296.4; 307/272.1;
307/443; 307/592; 307/100; 307/296.5;
307/272.3
[58] Field of Search ............ 307/200 A, 200 B, 296.4,
307/296.5, 296.1, 272.3, 443, 572, 592, 160, 135

[56] References Cited

U.S. PATENT DOCUMENTS

| | | | |
|---|---|---|---|
| 4,607,178 | 8/1986 | Sugie et al. ........................ | 307/594 |
| 4,626,249 | 12/1971 | Snedeker ........................ | 307/100 |
| 4,628,218 | 12/1986 | Nakaizumi ........................ | 307/443 |
| 4,716,302 | 12/1987 | Fannagan et al. .............. | 307/200 B |

Primary Examiner—John S. Heyman
Assistant Examiner—Richard Roseen
Attorney, Agent, or Firm—Finnegan, Henderson, Farabow, Garrett, & Dunner

[57] ABSTRACT

A semiconductor device having an input protection circuit is disclosed. The semiconductor device includes a power-on reset circuit which generates a pulse having a pulse width determined according to an input surge, applied to an input terminal when an input voltage has risen to a preset level. In response to a pulse generated by the power-on reset circuit, a CMOS inverter supplies a predetermined voltage to the base of a bipolar transistor and controls the bipolar transistor so that it clamps an input voltage supplied thereto to a voltage level lower than the withstanding voltage of the internal circuit in a period corresponding to the pulse width. Thus, the input protection circuit constituted by the bipolar transistor clamps an input voltage, supplied by the input terminal to the internal circuit, to a predetermined level. In this invention, the control circuit activates the bipolar transistor at the time the input voltage rises and keeps it active while the power-on reset circuit is generating a pulse, causing an input surge to be bypassed through the bipolar transistor, during this period of time. Thus, the input voltage can be clamped to a level lower than the withstanding voltage of the internal circuit, protecting the internal circuit, even when a surge voltage higher than the withstanding voltage is generated.

2 Claims, 2 Drawing Sheets

SEMICONDUCTOR INTEGRATED CIRCUIT WITH INPUT PROTECTION CIRCUIT

BACKGROUND OF THE INVENTION

This invention relates to a semiconductor integrated circuit with an input protection circuit.

In the prior art CMOS integrated circuit constituting a memory, for example, an input protection circuit is connected to a power source input terminal (Vcc pin). The input protection circuit has npn parasitic bipolar transistor 11 formed in substrate (p-type substrate) of the integrated circuit as shown in FIG. 1. Transistor 11 is formed of p-type of substrate 10 and n+-type diffusion layer 12 and 13. Further, a field oxide film 14 is formed on the surface of substrate 10 near n+-type diffusion layer 12 and 13.

The input protection circuit functions to clamps input voltage Vi supplied to power source input terminal 15 to preset voltage level Vcc, thus preventing a voltage higher than the withstanding breakdown voltage from being applied to an internal circuit such as a memory circuit in the integrated circuit. More specifically, capacitor 16 and resistor 17 are connected to power source input terminal 15 so that voltage Vcc at a constant level can be supplied to the internal circuit even when input voltage Vi changes according to the time constant defined by capacitor 16 and resistor 17 as shown in FIG. 2. Voltage Vcc is equal to the sum of breakdown voltage Vbd at the junction of n+-type diffusion layer 12 and p-type substrate 10 of bipolar transistor 11 and forward bias voltage Vf between substrate 10 and n+-type layer 13. That is, voltage Vcc is determined by the withstanding voltage at the junction in transistor 11 or the withstanding voltage of the clamp circuit. Further, it is necessary to set voltage Vcc lower than the withstanding voltage of the elements constituting the internal circuit.

However, the withstanding voltage of the element of the internal circuit is determined by patterns for manufacturing the integrated circuit, various process conditions and the like, and therefore it will generally fluctuate to a great extent. For this reason, the withstanding voltage of the clamp circuit may be set higher than that of the element of the internal circuit and in such a case the clamp circuit may not correctly function as an input protection circuit. In order to solve this problem, it is considered to set the withstanding voltage of the clamp circuit to a sufficiently low level. In this case, however, it is necessary to perform a special manufacturing step.

In the integrated circuit having the prior art input protection circuit, the withstanding voltage of a clamp circuit constituting the input protection circuit may happen to be higher than that of the internal circuit of the integrated circuit. In order to obviate such a possibility, a manufacturing step for setting the withstanding voltage of the clamp circuit sufficiently low must be performed. This makes the manufacturing process of the integrated circuit complicated, incurring a problem of high manufacturing cost.

SUMMARY OF THE INVENTION

An object of this invention is to provide a semiconductor integrated circuit with an input protection circuit which can protect the internal circuit from an input voltage higher than the withstanding voltage thereof without performing a complicated step in the manufacturing process of the integrated circuit.

This object can be attained by a semiconductor integrated circuit with an input protection circuit comprising an input protection circuit formed of a bipolar circuit constituting a clamp circuit for clamping an input voltage from an input terminal to an internal circuit to a predetermined voltage level, a power-on reset circuit for generating a pulse with a pulse width determined by an input surge applied to the input terminal when the input voltage has risen to a predetermined level, and a control circuit for controlling the bipolar transistor by applying a predetermined voltage to a base of the bipolar transistor in response to a pulse from the power-on reset circuit, thus causing the bipolar transistor to clamp a voltage on the internal circuit to a voltage level lower than the withstanding voltage of the internal circuit.

In this invention, the control circuit activates the bipolar transistor at the time of rise in the input voltage and during a period corresponding to the pulse width of a pulse generated from the power-on reset circuit so that an input surge supplied in this period can be bypassed through the bipolar transistor. By bypassing the input surge voltage, it is possible to clamp the level of an input voltage to the internal circuit to a voltage level lower than the withstanding voltage of the internal circuit, thus protecting the internal circuit from being destroyed by the input surge higher than the withstanding voltage at a high reliability.

This is, according to this invention, for example, in a CMOS integrated circuit, the bipolar transistor is operated as a clamp circuit for clamping a voltage level sufficiently lower than the withstanding voltage of the internal circuit only in a predetermined period starting from the time of applicatione of the input surge (at the time of power-on). Therefore, the internal circuit can be protected from the input surge and a power source voltage necessary for the normal operation can be supplied to the internal circuit after the predetermined period.

Thus, the internal circuit can be protected from an input voltage higher than the withstanding voltage at a high reliability without making the manufacturing process for the integrated circuit complicated.

DETAILED DESCRIPTION OF THE PREFERRED EMBODIMENTS

Figure 1:
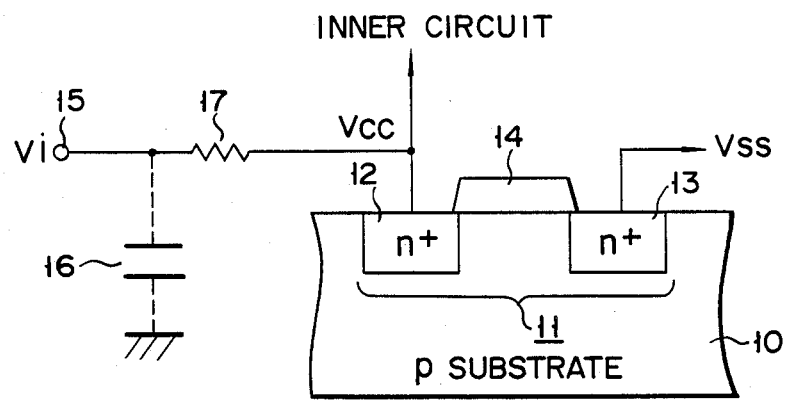
FIG. 1 is a circuit diagram of the prior art input protection circuit.
Figure 2:
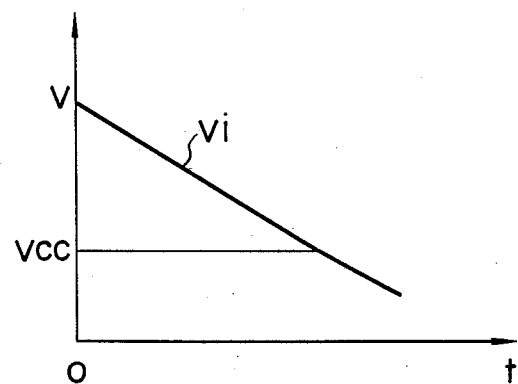
FIG. 2 is a characteristic diagram for illustrating the operation of the prior art input protection circuit shown in FIG. 1.
Figure 3:
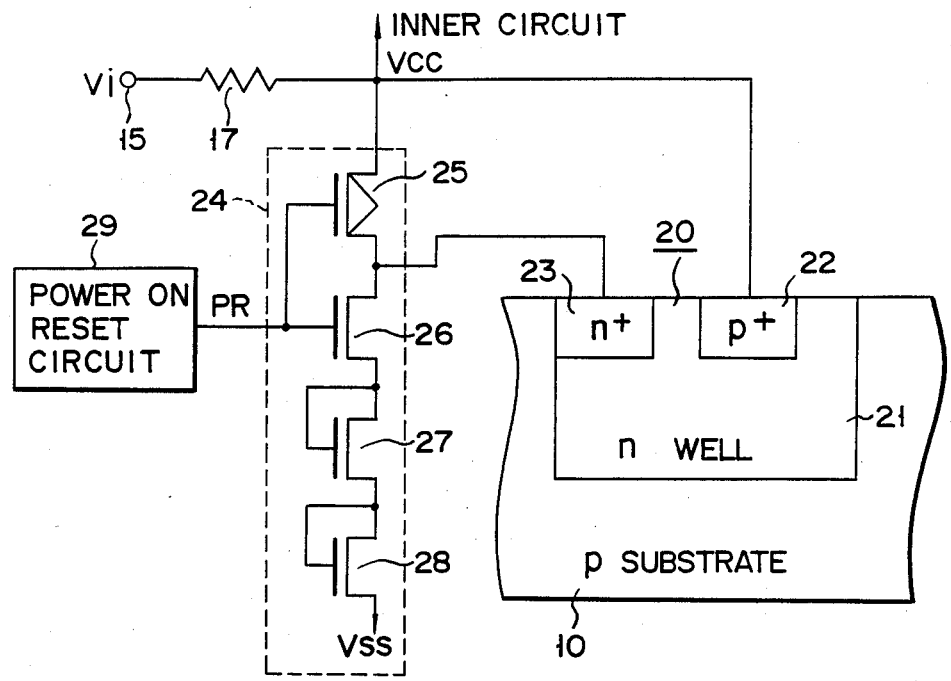
FIG. 3 is a circuit diagram of a semiconductor device including an input protection circuit according to one embodiment of this invention.

There will now be described an embodiment of this invention with reference to the drawings. FIG. 3 is a circuit diagram showing a semiconductor device having an input protection circuit according to one embodiment of this invention. In FIG. 3, pnp bipolar transistor 20 is formed in n-type well 21 which is formed in p-type substrate 10 and is used to constitute a CMOS integrated circuit. Transistor 20 has p+-type region 22 formed as an emitter in n-type well 21, n-type well 21 serving as a base and substrate 10 serving as a collector. Further, n+-type region 23 is formed near p+-type region 22 in the surface of n-type well 21. Power source input terminal 15 is connected to p+-type region 22 acting as an emitter of transistor 20, via resistor 17.

CMOS inverter circuit 24 includes p-channel MOS transistor 25, n-channel MOS transistor 26 and diode-connected n-channel MOS transistors 27 and 28. The connection node of MOS transistors 25 and 26 is connected to n+-type region 23 of transistor 20. Further, each of the gates of MOS transistors 25 and 26 is connected to an output terminal of power-on reset circuit 29.

Power-on reset circuit 29 supplies a pulse with a predetermined pulse width to the gates of MOS transistors 25 and 26, when voltage Vcc applied to the internal circuit has risen to a predetermined level.

Figure 4:
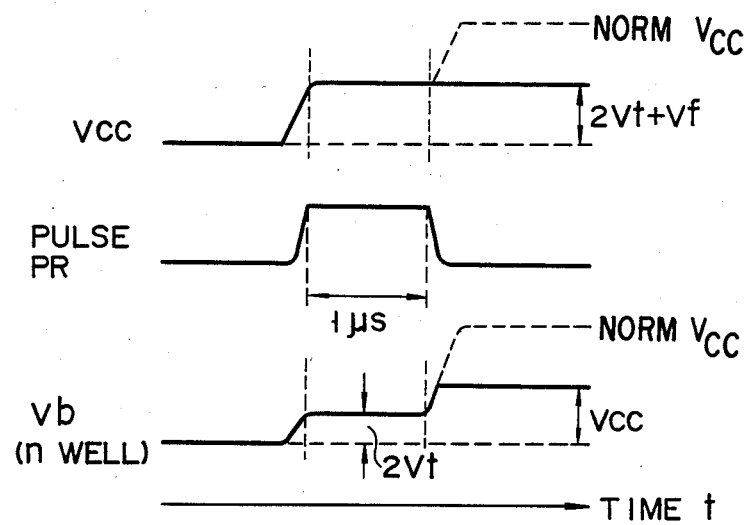
FIG. 4 is a characteristic diagram for illustrating the operation of the semiconductor device having the input protection circuit according to one embodiment of this invention shown in FIG. 3.

Now, the operation of the semiconductor device including the input protection circuit according to this invention will be explained. Assume that input surge Vi due to an electrostatic effect, for example, is applied to input terminal 15. In this case, as shown in FIG. 4, voltage Vcc starts to rise. When voltage Vcc rises, reaching a predetermined level, power-on reset circuit 29 generates pulse PR of, for example, 1 μs as shown in FIG. 4. In response to pulse PR, p channel MOS transistor 25 is turned off and n-channel MOS transistor 26 is turned on.

Thus, bipolar transistor 20 is turned on, permitting a forward current to flow from p-type region 22 to substrate 10 through n-type well 21. That is, the current due to input surge Vi is bypassed via bipolar transistor 20 so as to clamp voltage Vcc to predetermined voltage level "2 Vt+Vf". The voltage of 2 Vt is equal to the sum of the threshold voltages of MOS transistors 27 and 28. Thus, n-type well 21 is clamped to a voltage of 2 Vt as shown in FIG. 4. Vf is a forward voltage between p+-type region 22 and n-type well 21.

When pulse PR from power-on reset circuit 29 falls, MOS transistor 25 is turned on and MOS transistor 26 is turned off. Therefore, voltage Vb applied to n+-type layer 23 (n-type well 21) changes from 2 Vt to Vcc, as shown in FIG. 4. This turns off bipolar transistor 20, preventing a forward current from flowing between p+-type region 22 and n-type well 21. At this time, if the power source is on, voltage Vcc changes to a normal power source voltage level, as shown by broken lines in FIG. 4, and is applied to an internal circuit such as a memory circuit of the integrated circuit.

As described above, at the input of input surge (or at the power-on time), bipolar transistor 20 constituting the clamp circuit, is turned on in response to a pulse of a predetermined pulse width and kept in a conductive state for a period of time corresponding to the pulse width. In this case, the pulse width is set sufficiently long enough so that an entire current, due to the input surge, can finish it's flow within the period of time.

Bipolar transistor 20 acts as a bypass in the time period determined by the pulse width to clamp voltage Vcc to predetermined level "2 Vt+Vf". Thus, due to the application of an input surge at a high reliability, an input voltage higher than the withstanding voltage of the element is prevented from being applied to the internal circuit of the integrated circuit, protecting it from being destroyed.

That is, the withstanding voltage of the clamp circuit can be set sufficiently lower than that of the element in the time period corresponding to the pulse width. As a result, the bipolar transistor can function as an input protection circuit with a high reliability. In this case, bipolar transistor 20 can be formed by making use of part of the manufacturing process for the CMOS integrated circuit. Therefore, a reliable input protection circuit or clamp circuit can be constructed without having to perform any additional steps of lowering the withstanding voltage.

Further, after the time lapse, corresponding to the pulse width, bipolar transistor 20 is turned off and the normal power-on operation is effected to supply a preset power source voltage to the internal circuit.

In the embodiment as described above, the clamp voltage at the n-type well 21 is set at 2 Vt, as shown in FIG. 4. However, in general, it is satisfactory if clamped voltage Vcc is set at a high enough voltage to operate power-on reset circuit 29, while still being lower than the withstanding voltage of the element of the internal circuit. Thus, the clamped voltage may be set to a suitable value according to the withstanding voltage of the respective elements.

What is claimed is:

1. A semiconductor device with an input protection circuit comprising:
    an input protection circuit including a bipolar circuit constituting a clamp transistor, for clamping, to a predetermined voltage level, an input voltage from an input terminal to an internal circuit;
    a power-on reset circuit for generating a pulse with a pulse width determined by the time of an input surge applied to said input terminal when the input voltage has risen to a predetermined level; and
    a control circuit for controlling said bipolar transistor by applying a predetermined voltage to a base of said bipolar transistor, in response to a pulse from said power-on reset circuit, thus causing said bipolar transistor to clamp a voltage to said internal circuit to a voltage level lower than the breakdown voltage of said internal circuit.

2. A semiconductor device with an input protection circuit according to claim 1, wherein said control circuit includes p and n-channel transistors which are set in opposite conduction states, in response to a pulse generated from said power-on reset circuit, and at least one other n-channel transistor which is connected in series with said n channel transistor, and whose gate and drain are connected to one another.

* * * * *